(12) United States Patent
Tutt et al.

(10) Patent No.: US 8,946,070 B2
(45) Date of Patent: Feb. 3, 2015

(54) FOUR TERMINAL TRANSISTOR FABRICATION

(71) Applicants: Lee W. Tutt, Webster, NY (US); Shelby F. Nelson, Pittsford, NY (US)

(72) Inventors: Lee W. Tutt, Webster, NY (US); Shelby F. Nelson, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 13/921,279

(22) Filed: Jun. 19, 2013

(65) Prior Publication Data

US 2014/0377943 A1     Dec. 25, 2014

(51) Int. Cl.
| | |
|---|---|
| *H01L 21/3205* | (2006.01) |
| *H01L 21/283* | (2006.01) |
| *H01L 21/28* | (2006.01) |

(52) U.S. Cl.
CPC ........ *H01L 21/28008* (2013.01); *H01L 21/283* (2013.01)
USPC ........... 438/586; 438/156; 438/158; 438/260; 438/571; 438/666

(58) Field of Classification Search
None
See application file for complete search history.

(56) References Cited

U.S. PATENT DOCUMENTS

| | | |
|---|---|---|
| 5,475,238 A | 12/1995 | Hamada |
| 5,547,883 A | 8/1996 | Kim |
| 5,780,911 A | 7/1998 | Park et al. |
| 7,413,982 B2 | 8/2008 | Levy |
| 7,456,429 B2 | 11/2008 | Levy |
| 7,985,684 B1 * | 7/2011 | Tutt et al. ............... 438/699 |
| 2008/0166884 A1 | 7/2008 | Nelson et al. |
| 2009/0130858 A1 | 5/2009 | Levy |
| 2013/0082746 A1 | 4/2013 | Nelson et al. |

FOREIGN PATENT DOCUMENTS

JP     2-140863     11/1990

* cited by examiner

*Primary Examiner* — Kyoung Lee
(74) *Attorney, Agent, or Firm* — William R. Zimmerli (57) ABSTRACT

Producing a transistor includes providing a substrate including in order a first electrically conductive material layer positioned on the substrate and a first electrically insulating material layer positioned on the first electrically conductive material layer. A gate including a reentrant profile is formed from an electrically conductive material layer stack provided on the first electrically insulating material layer in which a first portion of the gate is sized and positioned to extend beyond a second portion of the gate. The gate including the reentrant profile and at least a portion of the first electrically insulating material layer are conformally coated with a second electrically insulating material layer. The second electrically insulating material layer is conformally coated the with a semiconductor material layer. A source and drain electrodes are formed simultaneously by directionally depositing a second electrically conductive material layer on portions of the semiconductor material layer.

6 Claims, 12 Drawing Sheets

FOUR TERMINAL TRANSISTOR FABRICATION

CROSS REFERENCE TO RELATED APPLICATIONS

Reference is made to commonly-assigned, U.S. patent application Ser. No. 13/921,258 entitled "FOUR TERMINAL TRANSISTOR", and Ser. No. 13/921,267 entitled "CIRCUIT INCLUDING FOUR TERMINAL TRANSISTOR", filed concurrently herewith.

FIELD OF THE INVENTION

This invention relates generally to semiconductor devices and in particular to transistor devices.

BACKGROUND OF THE INVENTION

In semiconductor processing technology, planar substrate surfaces which are horizontal with respect to a wafer surface are patterned by photolithographic methods in combination with selective etching processes. During the processing of integrated circuits, reliefs with a pronounced topography are formed on the wafer or substrate surface. Typically, this type of relief includes surfaces which are inclined or vertical with respect to the substrate surface. As sizes of integrated circuits continue to shrink, it is becoming more and more necessary to pattern vertical or inclined device surfaces so as to functionally differentiate these devices over their vertical extent while still maintaining pattern alignment. Examples of these types of semiconductor devices include deep trench capacitors, stacked capacitors, and vertical transistors.

Currently, it is not possible to put patterns directly on walls which are vertical with respect to the substrate surface using conventional photolithographic techniques. Usually, vertical wall patterning of this nature is accomplished using a suitable filler material which, when partially filling in a trench, acts as a mask for the portions of the wall located underneath while allowing for processing of the walls above the filler material. For example, when an oxide is to be deposited exclusively on vertical walls below a filler material, the oxide is first deposited or produced over the entire surface of the relief. The relief or trench is initially completely filled with a suitable filler material. Then, the filler material is recessed back to a depth that just covers the desired oxide. After uncovered sections of the oxide are removed, the remaining filler material is removed.

Alternatively, when an oxide is to be deposited or produced only in upper regions of a vertical wall, an etching stop layer, for example, a nitride layer is first provided over the entire surface of the entire relief pattern. A different material, susceptible to directional etching, for example, polycrystalline silicon, is used to fill the relief, and is etched back as far as the desired coverage depth of the final vertical oxide. After the etching stop layer is removed from the unfilled sections of the walls, an oxide is deposited or generated using a thermal technique in the uncovered regions. Next, the oxide is anisotropically etched which removes the deposited oxide from horizontal. This is followed by removal of the filler material and, then, the removal of the etching stop layer.

There are deposition processes which can be used to deposit thin films on vertical or inclined surfaces of a substrate relief. However, it is difficult to control the thickness of the layer deposited. Typically, the thickness of the coating decreases as the depth of the relief increases, for example, as the length of the vertical or inclined wall increases. As such, layers deposited using these types of deposition processes have considerable differences in thickness over the length of the relief. These types of deposition processes include plasma-enhanced chemical vapor deposition (PECVD) and diffusion-limited deposition of silicon oxide using tetraethyl orthosilicate (TEOS).

Vertical transistors having a reentrant profile may need monitoring with respect to the amount of overhang or level of reentrant profile. While a deeper reentrant profile assures a clean break between source and drain it can lead to un-gated regions and hence to poorer transistor quality. Therefore, there is a need for a vertical transistor having transistor characteristics with reduced sensitivity to the shape of the overhang or reentrant profile.

There is also an ongoing need to provide semiconductor device architectures that include patterned vertical or inclined device surfaces. There is also an ongoing need to provide manufacturing techniques capable of processing small device features of semiconductor devices without requiring high resolution alignment tolerances. There is also an ongoing need to provide higher current semiconductor devices by improving the series resistance of the device.

SUMMARY OF THE INVENTION

According to one aspect of the present invention, a method of producing a transistor includes providing a substrate including in order a first electrically conductive material layer positioned on the substrate and a first electrically insulating material layer positioned on the first electrically conductive material layer. An electrically conductive material layer stack is provided on the first electrically insulating material layer. A gate including a reentrant profile is formed from the electrically conductive material layer stack in which a first portion of the gate is sized and positioned to extend beyond a second portion of the gate. The gate including the reentrant profile and at least a portion of the first electrically insulating material layer are conformally coated with a second electrically insulating material layer. The second electrically insulating material layer is conformally coated the with a semiconductor material layer. A source and drain electrodes are formed simultaneously by directionally depositing a second electrically conductive material layer on portions of the semiconductor material layer.

BRIEF DESCRIPTION OF THE DRAWINGS

In the detailed description of the example embodiments of the invention presented below, reference is made to the accompanying drawings, in which.

DETAILED DESCRIPTION OF THE INVENTION

The present description will be directed in particular to elements forming part of, or cooperating more directly with, apparatus in accordance with the present invention. It is to be understood that elements not specifically shown or described may take various forms well known to those skilled in the art. In the following description and drawings, identical reference numerals have been used, where possible, to designate identical elements.

The example embodiments of the present invention are illustrated schematically and not to scale for the sake of clarity. One of ordinary skill in the art will be able to readily determine the specific size and interconnections of the elements of the example embodiments of the present invention.

Figure 1:
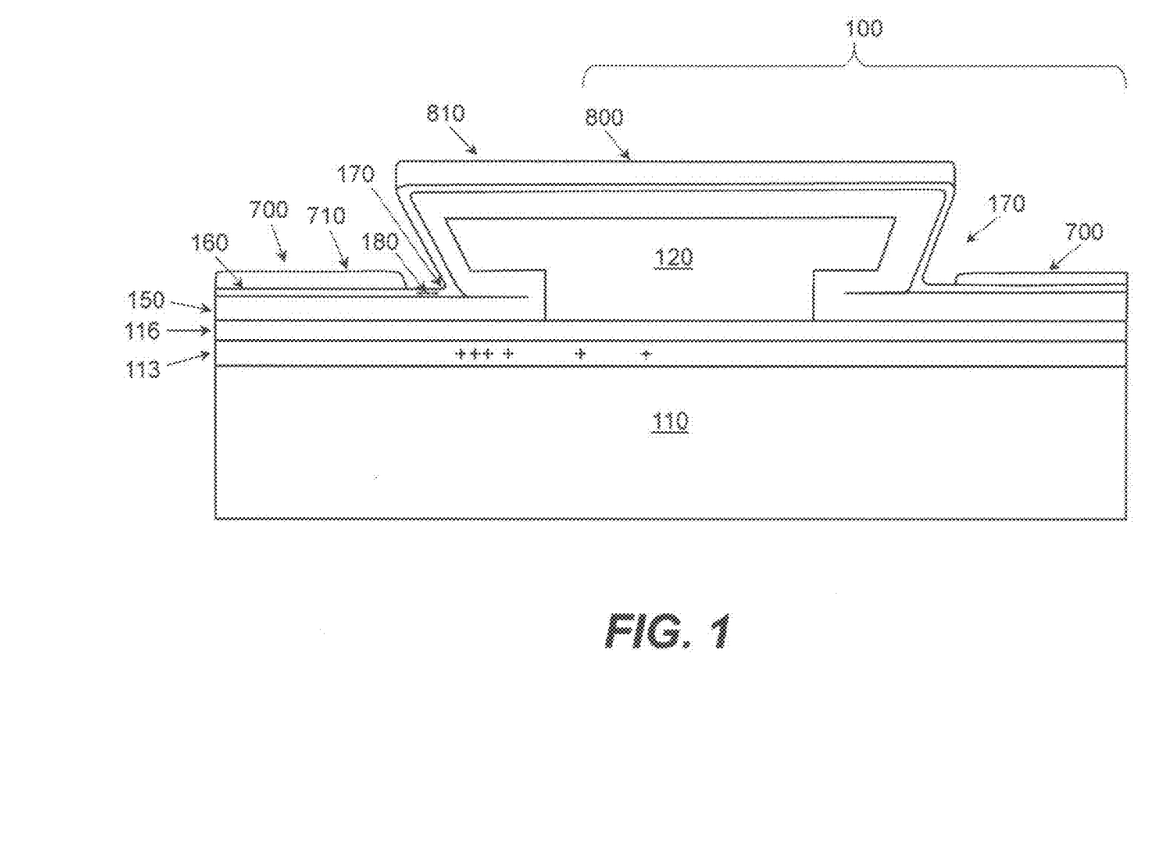
FIG. 1 is a schematic cross sectional view of an example embodiment of a 4 terminal transistor made in accordance with the present invention.

Referring to FIG. 1, a schematic cross sectional view of a vertical transistor 100 is shown. Transistor 100 includes a substrate 110, and a first electrically conductive material layer 113 (commonly referred to as a bias gate) and a first electrically insulating layer 116. An electrically conductive material layer stack 120 (commonly referred to as a gate) is located on the first electrically insulating layer 116. Transistor 100 also includes a second electrically insulating material layer 150 and a semiconductor material layer 160. An electrode or electrodes 710 and an electrode 810 are also included in transistor 100.

Electrically conductive material layer stack 120 includes one or more conductive material layers. Electrically conductive material layer stack 120 is positioned above substrate 110 such that a first surface of electrically conductive material layer stack 120 contacts a second surface of first electrically insulating layer 116. The first surface of first electrically insulating layer 116 contacts the first electrically conductive layer 113. Substrate 110, often referred to as a support, can be rigid or flexible.

Electrically conductive material layer stack 120 is appropriately etched (or shaped) to create a reentrant profile 170 in transistor 100. The reentrant profile 170 shields at least some of the electrically conductive material layer stack 120 from material deposited (or coated) using a directional (or line of sight) deposition (or coating) process because the reentrant profile 170 of the electrically conductive material layer stack 120 includes a first portion of electrically conductive material layer stack 120 that overhangs a second portion of electrically conductive material layer stack 120. When electrically conductive material layer stack 120 includes two or more material layers, the electrically conductive material layer stack 120 can include more than one reentrant profile. For example, and referring back to FIG. 1, electrically conductive material layer stack 120 can include two material layers and two reentrant profiles.

Electrically insulating material layer 150 conforms to the reentrant profile 170 of transistor 100. Electrically insulating material layer 150 includes first and second surfaces with the first surface being in contact with portions of surfaces of the electrically conductive layer stack 120 and first electrically insulating layer 116. Semiconductor material layer 160 conforms to electrically insulating material layer 150. Semiconductor layer 160 includes first and second surfaces with the first surface being in contact with the second surface of electrically insulating layer 150. Distinct (or separate, or different) portions of the second surface of semiconductor layer 160 are in contact with electrode(s) 710 and electrode 810.

Electrode(s) 710 includes a third electrically conductive material layer 700. When there is more than one electrode 710, different discrete discontinuous portions of third electrically conductive material layer 700 form electrodes 710. Electrode 810 includes a fourth electrically conductive material layer 800. Electrode(s) 710 and electrode 810 are positioned or spaced apart from each other at different locations of transistor 100. Electrode(s) 710 and electrode 810 can be different portions of the same material layer (either material layer 700 or material layer 800). When this happens, the third and fourth electrically conductive material layers 700 and 800 are different discrete discontinuous portions of the same material layer, for example, material layer 700. The material layer, for example, layer 700, is preferably deposited in a single collimated deposition during which reentrant profile 170 electrically separates each electrode from the other electrodes such that electrode(s) 710 and electrode 810 are included on distinct (different) discontinuous portions of the same electrically conductive material layer. Alternatively, the third and the fourth electrically conductive material layers 700, 800 can be distinct (different) material layers that are used to form electrode(s) 710 and 810.

The electrically conductive material layer stack 120 functions as the gate of transistor 100. In some example embodiments of transistor 100, one or both of electrodes 700 function as the drain of transistor 100 while electrode 810 functions as the source of transistor 100. In other example embodiments of transistor 100, one or both of electrodes 700 function as the source while electrode 810 functions as the drain.

The semiconductor device is actuated in the following manner. After transistor 100 is provided, a bias voltage is applied to the first electrically conductive layer 113. A voltage is applied between the third electrically conductive material layer 700 and the fourth electrically conductive material layer 800. A voltage is also applied to the electrically conductive material layer stack 120 to electrically connect the third electrically conductive material layer 700 (electrode 710) and the fourth electrically conductive material layer 800 (electrode 810). As described above, the third electrically conductive material layer 700 and the fourth electrically conductive material layer 800 can be the same material layer or can be different material layers.

The reentrant profile 170 of transistor 100 allows a dimension of the semiconductor material channel of the transistor to be associated with the thickness of the electrically conductive material layer stack 120, which functions as the gate, of transistor 100. Advantageously, this architecture of the present invention reduces reliance on high resolution or very fine alignment features during the manufacture of transistors that include small channels.

Referring to FIGS. 2 through 8, schematic cross sectional views of process steps associated with an example embodiment of a method of manufacturing transistor 100 are shown.

Generally described, transistor 100 is fabricated in the following manner. A substrate 110 is provided including a first electrically conductive material layer 113, a first electrically insulating material layer 116 and an electrically conductive material layer stack 120. A resist material layer 140 is deposited over the electrically conductive material layer stack 120. Resist material layer 140 is patterned to expose a portion of electrically conductive material layer stack 120, shown in FIG. 2. The exposed portion of electrically conductive material layer stack 120 is removed using a process which tends to create a reentrant profile in the electrically conductive material layer stack 120, as shown in FIG. 3. A plasma etching process is one example of a process which causes a portion of electrically conductive material layer stack 120 to overhang a different portion of electrically conductive material layer stack 120 in order to create reentrant profile 170. The resist material layer 140 can be deposited over electrically conductive material layer stack 120 and patterned in the same process step.

Figure 4:
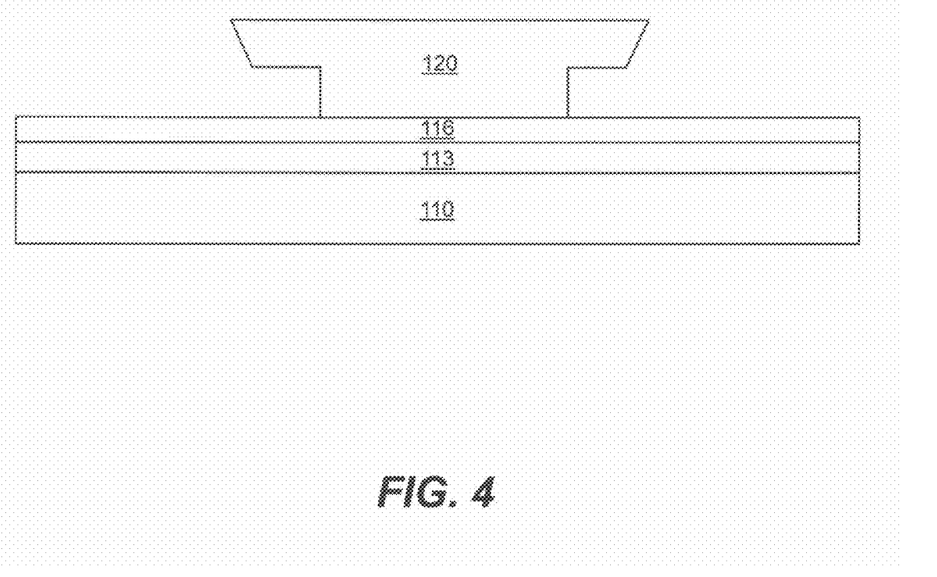
Figure 5:
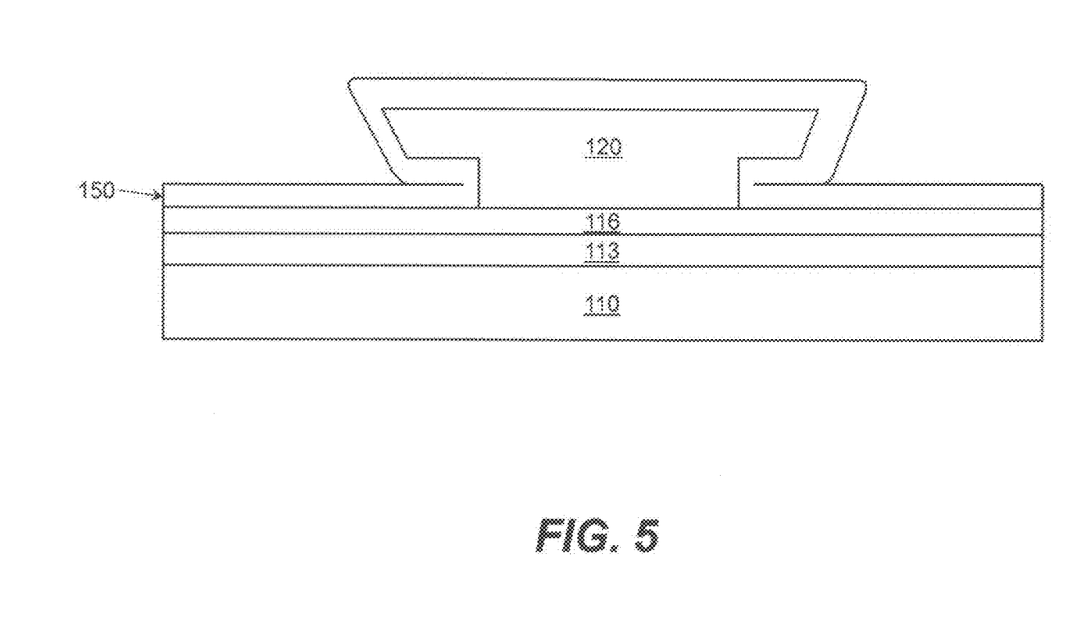
Figure 6:
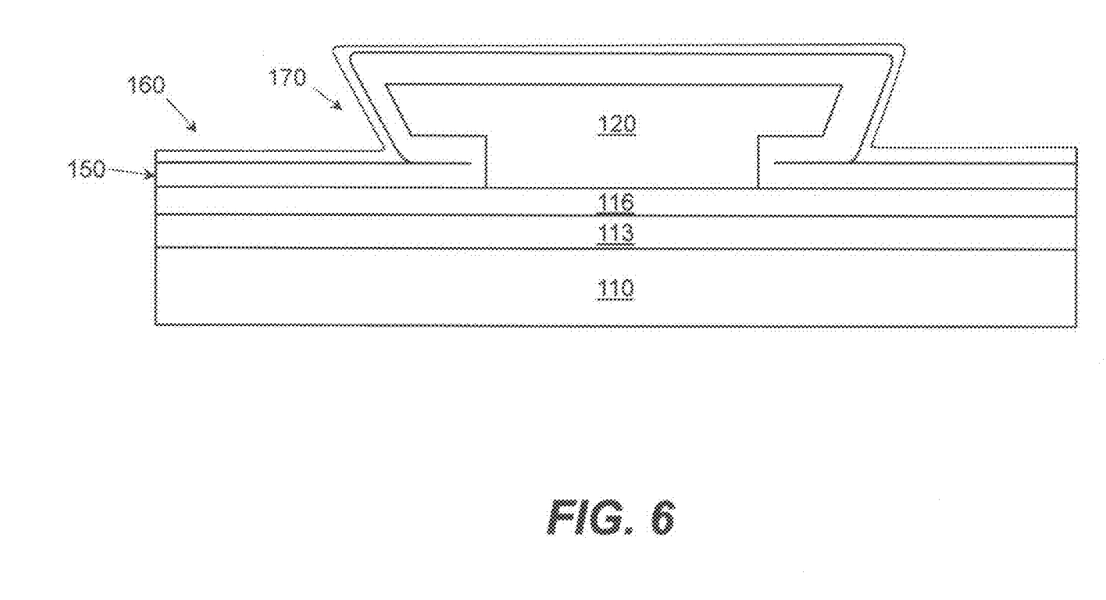
Figure 7:
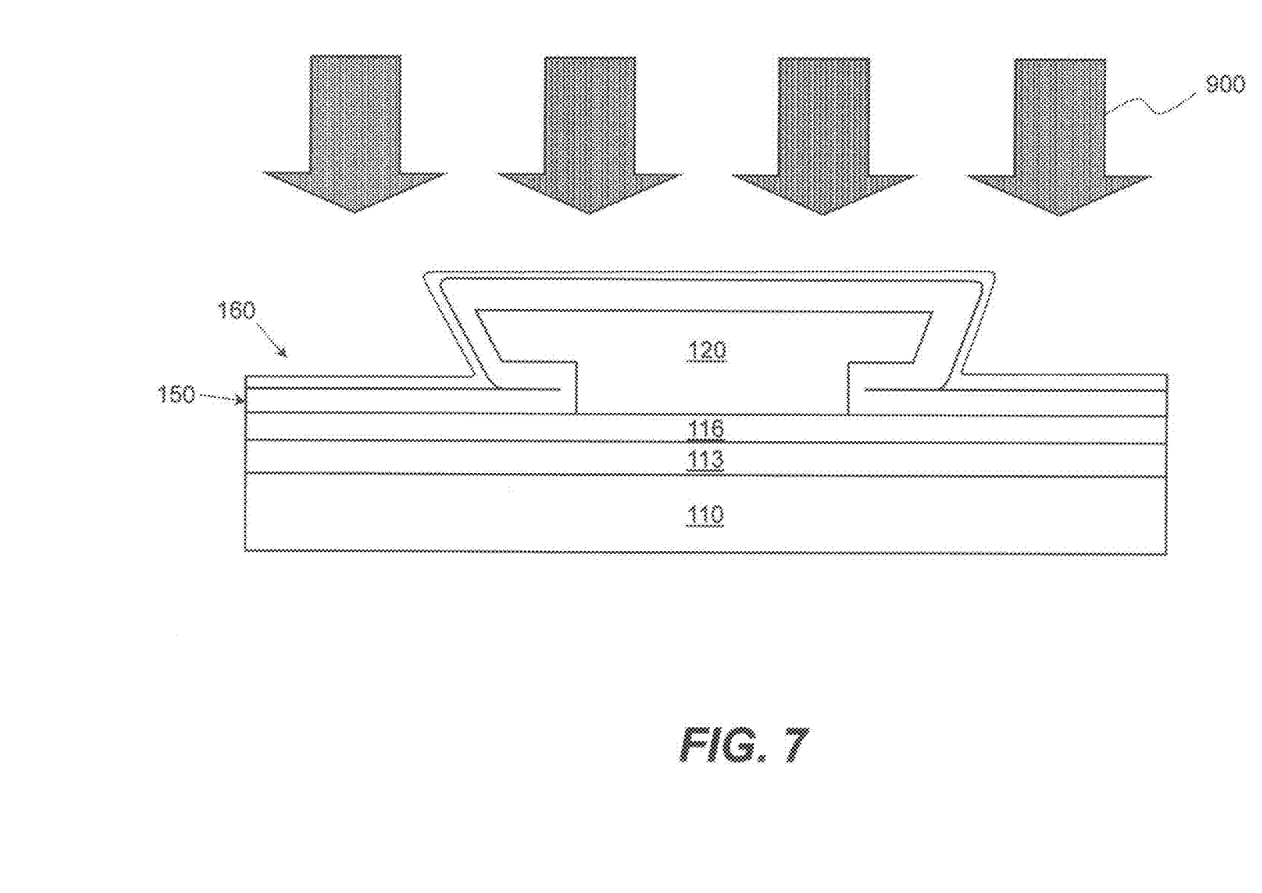

After removal of photoresist material layer 140, shown in FIG. 4. Exposed first electrically insulating layer 116 and the remaining exposed portions of electrically conductive material layer stack 120 are conformally coated with an electrically insulating material layer 150, shown in FIG. 5. The second electrically insulating material layer 150 is conformally coated with a semiconductor material layer 160, as shown in FIG. 6. An electrically conductive material layer, for example, material layer 700 or material layer 700 and material layer 800, is directionally (or nonconformally) deposited (shown using arrows 900) over semiconductor material layer 160, as shown in FIG. 7, in order to create electrode(s) 710 or electrode 810, shown in FIG. 1.

A plasma can be used to remove the exposed portion of the electrically conductive material layer stack 120 to create reentrant profile 170. In some example embodiments, substrate 110 can include more than one material layer. The additional material layer(s) is included in some instances to improve or maintain the structural integrity of substrate 110 during the manufacturing process. When substrate 110 includes more than one material layer, for example, a first material layer and a second material layer, the fabrication method can include removing the second material layer of substrate 110.

Referring back to FIGS. 2-7, vertical transistor device 100 begins with a substrate 110 that is coated with an electrically conductive layer 113 which will act as a bias gate and also coated with a non-conductive layer 116, either in whole or in part with respect to at least the portion of the substrate that is adjacent to conductive material layer stack 120 (the top of the first electrically insulating layer 116 as shown in FIG. 2), such that electrical shorting of transistor 100 does not occur. An electrically conductive material layer stack 120 is applied to (for example, deposited or coated) onto the first electrically insulating material. The electrically conductive material layer stack 120 functions as the gate of transistor 100. A resist material layer 140 is applied to the electrically conductive material layer stack 120. Resist 140 is patterned.

Substrate 110 does not interact appreciably with any of the material layers or the processing methods. Substrate 110, often referred to as a support, can be used for supporting the thin film transistor (also referred to as a TFT) during manufacturing, testing, or use. Those skilled in the art will appreciate that a support selected for commercial embodiments can be different from one selected for testing or screening embodiments. In some embodiments, substrate 110 does not provide any necessary electrical function for the TFT. This type of substrate 110 is termed a "non-participating support" herein. Useful substrate materials include organic or inorganic materials. For example, substrate 110 can include inorganic glasses, ceramic foils, polymeric materials, filled polymeric materials, coated metallic foils, acrylics, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly(ethylene terephthalate) (PET), poly(ether sulfone) (PES), poly(phenylene sulfide) (PPS), and fiber-reinforced plastics (FRP). The thickness of substrate 110 can vary, typically from about 100 μm to about 1 cm.

A flexible support or substrate 110 is used in some example embodiments of the present invention. Using a flexible substrate 110 allows for roll processing, which can be continuous, providing economy of scale and economy of manufacturing over flat or rigid supports. The flexible support chosen is preferably capable of wrapping around the circumference of a cylinder of less than about 50 cm in diameter, more preferably 25 cm in diameter, and most preferably 10 cm in diameter, without distorting or breaking, using low force as by unaided hands. The preferred flexible support can be rolled upon itself. Additional examples of flexible substrates include thin metal foils such as stainless steel provided the foils are coated with an electrically insulating material layer to electrically isolate the thin film transistor. If flexibility is not a concern, then the substrate can be a wafer or sheet made of materials including glass and silicon.

In some example embodiments, substrate 110 can include a temporary support or support material layer, for example, when additional structural support is desired for a temporary purpose, e.g., manufacturing, transport, testing, or storage. In these example embodiments, substrate 110 can be detachably adhered or mechanically affixed to the temporary support. For example, a flexible polymeric support can be temporarily adhered to a rigid glass support to provide added structural rigidity during the transistor manufacturing process. The glass support can be removed from the flexible polymeric support after completion of the manufacturing process.

The first electrically conductive layer 113 is applied to the substrate 110. In a first example embodiment the layer is not patterned and is uniformly coated. In a second example embodiment the layer is patterned to allow specific regions to have bias voltages.

The first electrically conductive material layer 113, also commonly referred to as a conductor, can be any suitable conductive material that permits conductive material layer. A variety of gate materials known in the art are also suitable, including metals, degenerately doped semiconductors, conductive polymers, and printable materials such as carbon ink, silver-epoxy, or sinterable metal nanoparticle suspensions. For example, the gate electrode can include doped silicon, or a metal, such as aluminum, chromium, gold, silver, nickel, copper, tungsten, palladium, platinum, tantalum, and titanium. Gate electrode materials can also include transparent conductors such as indium-tin oxide (ITO), ZnO, SnO2, or In2O3. Conductive polymers also can be used, for example polyaniline, poly(3,4-ethylenedioxythiophene)/poly(styrene sulfonate) (PEDOT:PSS). In addition, alloys, combinations, and multilayers of these materials can be used. The first electrically conductive layer 113 can be deposited on substrate 110 using chemical vapor deposition, sputtering, evaporation, doping, or solution processed methods.

The first electrically insulating layer 116 covers all exposed portions of the first electrically conductive material layer 113. The purpose of this layer is to act as a dielectric and an insulator to allow a voltage on first electrically conductive material layer 113 to be felt by layers on top of first electrically insulating layer 116 while preventing current to flow.

The first electrically insulating layer 116 is often referred to as a gate dielectric. Suitable electrically insulating materials include strontiates, tantalates, titanates, zirconates, aluminum oxides, silicon oxides, tantalum oxides, titanium oxides, silicon nitrides, barium titanate, barium strontium titanate, barium zirconate titanate. The first electrically insulating material electrically separates the first electrically conductive layer from the semiconductor material and the gate material that is to be applied.

The electrically conductive material layer stack 120, also commonly referred to as a gate electrode, can be any suitable conductive material that permits conductive material layer. A variety of gate materials known in the art are also suitable, including metals, degenerately doped semiconductors, conductive polymers, and printable materials such as carbon ink, silver-epoxy, or sinterable metal nanoparticle suspensions. For example, the gate electrode can include doped silicon, or a metal, such as aluminum, chromium, gold, silver, nickel, copper, tungsten, palladium, platinum, tantalum, and titanium. Gate electrode materials can also include transparent conductors such as indium-tin oxide (ITO), ZnO, SnO2, or In2O3. Conductive polymers also can be used, for example polyaniline, poly(3,4-ethylenedioxythiophene)/poly(styrene sulfonate) (PEDOT:PSS). In addition, alloys, combinations, and multilayers of these materials can be used. The gate electrode (electrically conductive material layer stack 120) can be deposited on the first electrically insulating layer 116 using chemical vapor deposition, sputtering, evaporation, doping, or solution processed methods.

Figure 2:
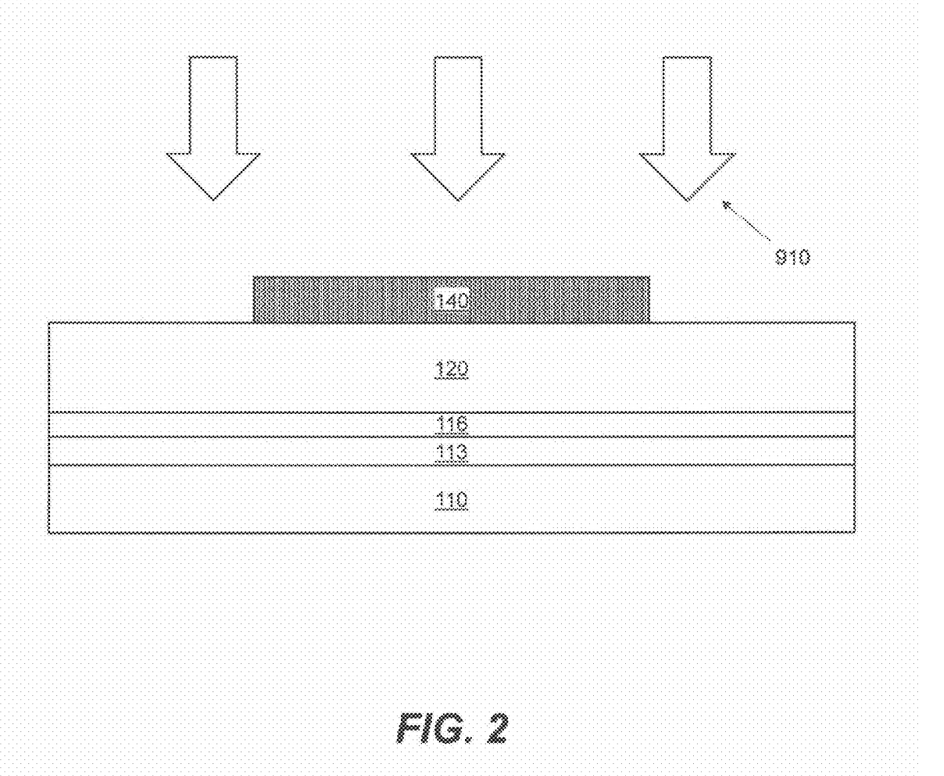
FIGS. 2 through 7 are schematic cross sectional views of process steps associated with an example embodiment of a method of producing the vertical transistor shown in FIG. 1.
Figure 3:
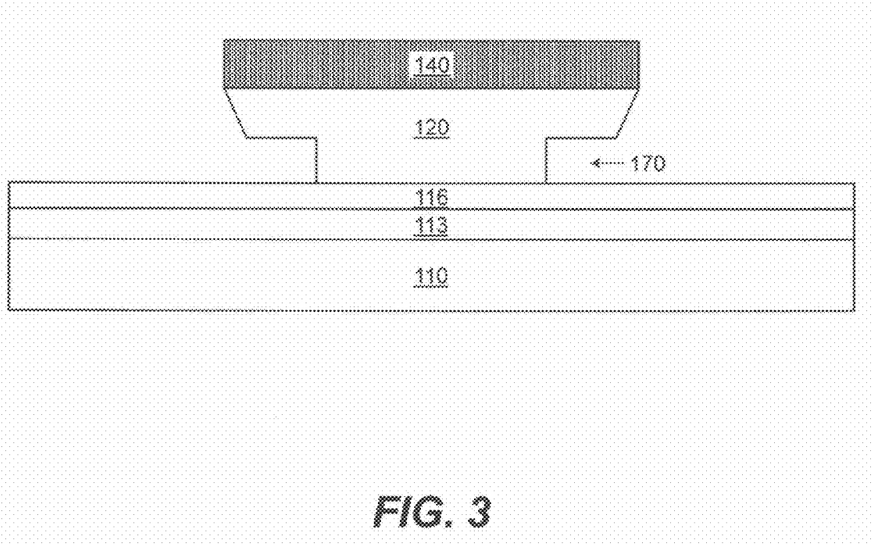

The thickness (the vertical direction as shown in FIG. 2) of the gate electrode 120 can vary, typically from about 100 to about 10000 nm. As the thickness defines the gate length, the thickness is usually thicker than twice the thickness of the conformally coated materials in order to reduce the likelihood of electrical shorting in subsequent applied material layers.

Resist 140 can be a conventional photoresist known in the art such as a polymeric positive acting resist or a negative resist. Resist 140 can be exposed through a mask with a low resolution (>0.1 mm) alignment to substrate 110 and developed to yield a pattern of resist. In another example embodiment, the pattern of resist 140 is accomplished using a printing process, for example, flexography or inkjet printing that prints the resist directly in a patterned manner without using a mask.

Referring back to FIG. 1, a schematic cross sectional view of transistor 100 material layers after material processing are shown. In FIG. 3, the electrically conductive material layer stack 120 is etched through patterned resist 140 to create a reentrant profile 170. The etchant can be any organic or inorganic material which, when used in a suitable etching process, removes the conductive material without substantially attacking resist 140 and provides the reentrant profile 170. The etchant can have little impact on the first electrically insulating material layer 116. As such, the selected etchant often depends on both the first electrically insulating material layer 116 and the second electrically conductive material 120.

Referring back to FIG. 4, at this point, resist 140 is removed. If any of the resist 140 remains over the electrically conductive material layer stack 120. Gentle cleaning can be performed on the electrically conductive material layer stack 120, if desired, provided that the cleaning process does not remove the reentrant profile 170.

Referring back to FIGS. 5 and 6, schematic cross sectional views of the semi-conductor device after conformal coating of a dielectric nonconductive material, often referred to as an insulator, and a semiconductor material, respectively, are shown. Referring to FIG. 5, a dielectric nonconductive material 150 is then conformally coated using a conformal coating deposition process over first electrically insulating material layer 116 and the reentrant feature formed at the edge of conductive material layer stack 120. Applying a second dielectric nonconductive material 150 using a conformal coating process helps to maintain the reentrant profile 170.

The second dielectric nonconductive material 150 is often referred to as the gate dielectric. Suitable nonconductive materials include strontiates, tantalates, titanates, zirconates, aluminum oxides, silicon oxides, tantalum oxides, titanium oxides, silicon nitrides, barium titanate, barium strontium titanate, barium zirconate titanate. As the dielectric material separates the gate conductor from the semiconductor material that is to be applied, it is important that the conformally coated material be provided with a consistent or uniform thickness at least in the region where the reentrant profile 170 and the gate are located.

Preferred processes for accomplishing conformal coating include atomic layer deposition (ALD) or one of its derivatives such as spatial ALD (S-ALD) or plasma enhanced ALD (PEALD) because these processes yield a uniform thickness coating over or on a highly varying topology. ALD and S-ALD are discussed in more detail below.

Referring to FIG. 6, a semiconductor material 160 is then coated using a conformal coating deposition process which helps to maintain the reentrant profile 170. This conformal coating process can be the same process used previously to coat the dielectric material. Alternatively, the conformal coating process can be different. As the semiconductor material 160 acts as a channel between electrode(s) 710 and electrode 810 when the second electrically conductive material 120 is energized, it is important that the conformally coated material be provided with a consistent or uniform thickness at least in the region where the reentrant profile 170 and the gate are located and more preferable in the areas between electrode(s) 710 and electrode 810 including the area where the reentrant profile 170 and the gate are located. A preferred process for conformally coating includes atomic layer deposition (ALD) or spatial ALD (S-ALD), a derivative of ALD. Either process, discussed in more detail below, yields a uniform thickness on a highly varying topology.

Atomic Layer Deposition (ALD) is a process which is used to produce coatings with thicknesses that can be considered consistent, uniform, or even exact. ALD produces coatings that can be considered conformal or even highly conformal material layers. Generally described, an ALD process accomplishes substrate coating by alternating between two or more reactive materials commonly referred to as precursors, in a vacuum chamber. A first precursor is applied to react with the substrate. The excess of the first precursor is removed from the vacuum chamber. A second precursor is then applied to react with the substrate. The excess of the second precursor is removed from the vacuum chamber and the process is repeated.

Recently, a new ALD process has been developed which negates the need for a vacuum chamber. This process, commonly referred to as S-ALD, is described in at least one of U.S. Pat. No. 7,413,982, U.S. Pat. No. 7,456,429, US 2008/0166884, and US 2009/0130858, the disclosures of which are incorporated by reference herein. S-ALD produces coatings with thicknesses that can be considered consistent, uniform, or even exact. S-ALD produces coatings that can be considered conformal or even highly conformal material layers. S-ALD is also compatible with a low temperature coating environment. Additionally, S-ALD is compatible with web coating, making it attractive for large scale production operations. Even though some web coating operations may experience alignment issues, for example, web tracking or stretching issues, the architecture of the present invention reduces reliance on high resolution or very fine alignment features during the manufacturing process. As such, S-ALD is well suited for manufacturing the present invention.

The semiconductor material layer 160, often referred to as a semiconductor, can be any type of semiconductor provided the semiconductor material can be deposited or coated using a conformal coating process such as ALD or S-ALD. Examples of suitable semiconductor materials include zinc oxide, zinc chalcogenides, indium tin oxides, gallium indium tin oxides, gallium tin oxides, cadmium chalcogenides, gallium pnictides, aluminum nictides, germanium, and silicon.

The semiconductor can optionally be doped with other materials to increase or decrease the conductivity. In some example embodiments, a depletion mode device is desirable, and therefore carriers can be added through the use of dopants. When the semiconductor is a zinc oxide, the use of an aluminum dopant, for example, increases the electron carrier density. In this configuration, the gate is typically used to turn off the device by making it negative relative to the drain and source.

A compensating dopant can also be used to deplete the intrinsic carrier density. When the semiconductor is zinc oxide, the use of nitrogen has been found to decrease the electron carrier density making it less n-type. In this configuration, the semiconductor can be made to operate in an accumulation mode to turn on the transistor when a positive gate voltage is applied. These dopants are often added as compounds during the growth process but can also be added after the semiconductor material layer has been applied using a process such as ion implantation and thermal diffusion.

Referring back to FIGS. 1 and 7, schematic cross sectional views of the semiconductor device during, and after directional coating of an electrically conductive material are shown. After semiconductor material layer 160 has been deposited, electrode(s) 710 and electrode 810 are formed by depositing a third electrically conductive material layer 700 (and a fourth electrically conductive material layer 800 is some example embodiments) using a directional (or line-of-sight) deposition process which does not deposit or coat material into the reentrant profile 170. This can also be referred to as a nonconformal deposition process. Examples of suitable directional deposition processes include thermal evaporation, electron beam evaporation, sputtering, or laser ablation. The active channel gap between electrode(s) 710 and electrode 810 is maintained by the shadow cast by the reentrant profile 170 of the electrically conductive material layer stack 120. Electrode(s) 710 and Electrode 810 function as the source or drain of transistor 100.

The drain and the source of transistor 100 can be selected from either of electrode 710 and electrode 810 with the selection typically being based on the application and the characteristics of the contemplated device. As shown in FIG. 1, electrode 810 is on the top of the mesa formed by conductor 120 while electrode(s) 710 is not. As such, electrode 710 and electrode 810 are on different planes. Any necessary interconnects can be accomplished using conventional techniques that are well known in the art, for example, material layer leveling and via feed-through.

Although shown as a single material layer, the first electrically conductive layer 113, the first electrically insulating material layer 116, and the electrically conductive material layer stack 120, substrate 110, the dielectric nonconductive material layer 150, semiconductor material layer 160, electrode(s) 710, electrode(s) 810 or combinations thereof can include one or more layers provided that the functional role of the layer remains unchanged. Additional layers, for example, leveling layers, barrier layers, adhesion layers, can be included in the semiconductor device as long as the function of the layers described above is preserved.

In operation, a voltage is applied to the first electrically conductive material (bias gate) 113. This bias voltage modifies the number of carriers in the semiconductor layer 160 in the shadowed regions between the electrode 710 and the gate electrode 120. This bias can therefore be used to improve or degrade the transistor quality by in effect switching on or off a section of the channel not affected strongly by the gate electrode 120.

Experimental Results

A 100 nm chromium material layer was deposited via sputtering on a 62.5 mm square glass substrate.

The substrate was then conformally coated with a material layer 200 nm thick of aluminum oxide at 200 degrees Celsius using the S-ALD process described in U.S. Pat. No. 7,413,982 and the S-ALD apparatus described in U.S. Pat. No. 7,456,429 with the organo-metallic precursors trimethyl aluminum and water with an inert carrier gas of nitrogen.

A 450 nm molybdenum material layer was deposited via sputtering on a 62.5 mm square glass substrate.

A patterned material layer of photoresist was formed by spin coating at 1000 rpm Microposit S1805 resist (Rohm and Haas Electronic Materials LLC, Marlborough, Mass.) placed on a hot plate for 60 sec at 115 degrees Celsius and then exposed through a glass/chromium contact mask including lines for 79 seconds on a Cobilt mask aligner (Cobilt model CA-419 from Computervision Corporation, Sunnyvale, Calif.), using only the edges of the glass substrate as a low resolution or crude alignment. The sample was then developed for 60 seconds in Microposit MF-319 developer (Rohm and Haas Electronic Materials LLC, Marlborough, Mass.) and rinsed for 5 minutes in DI water.

The conductive molybdenum covered sample was plasma etched at 20 C with 0.45 Torr $SF_6$ at 500 W for 10 minutes and then cleaned with 0.3 ton $O_2$ plasma at 200 W for 2 minutes using a Technics plasma etcher. The substrate was then rinsed with acetone to remove the photo resist, then rinsed in HPLC grade isopropanol, and then allowed to dry.

The substrate was then conformally coated with a material layer 12 nm thick of aluminum oxide at 200 degrees Celsius using the S-ALD process as before.

The substrate was then conformally coated with a 12 nm material layer of zinc oxide at 200 degrees Celsius using the precursors diethyl zinc and concentrated ammonia solution and nitrogen as the carrier gas.

The electrodes were applied by evaporation. Aluminum was evaporated through a shadow mask including square holes which ran perpendicular and completely cross each line on the substrate. The aluminum was 50 nm thick.

Figure 8:
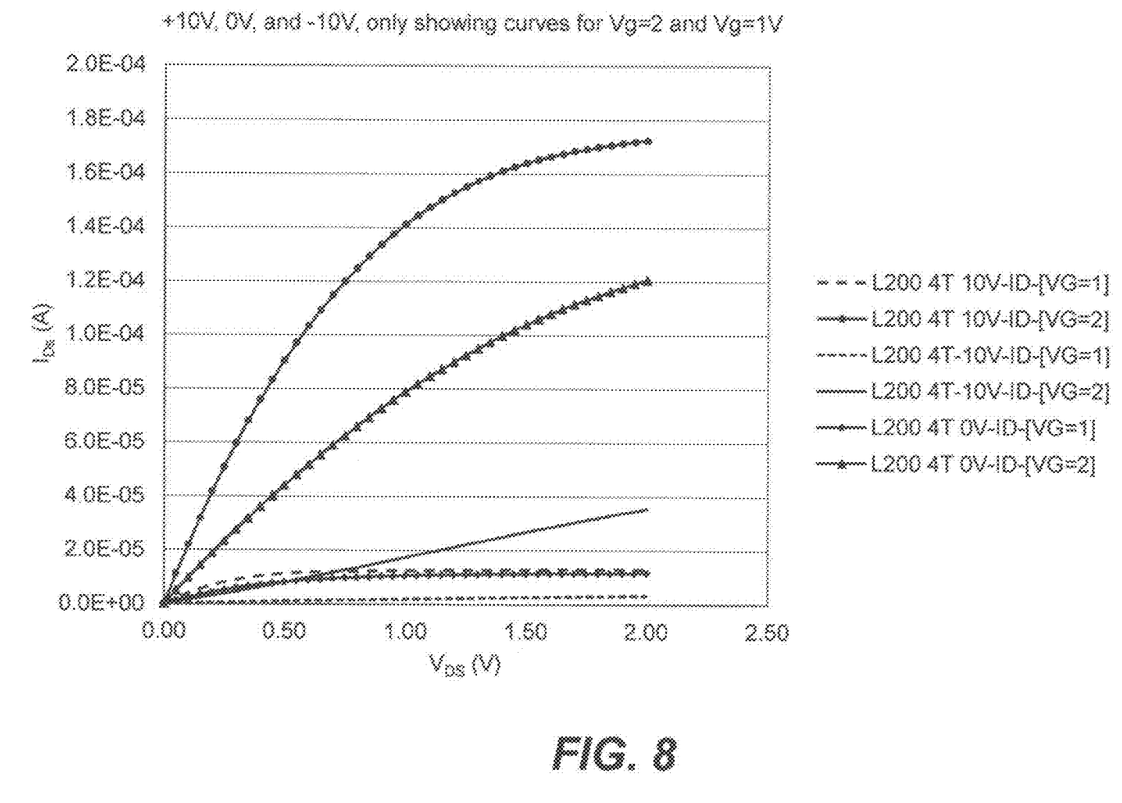
FIG. 8 is a graph showing performance $I_{ds}$-$V_d$ curve characteristics for the transistor shown in FIG. 1.

Testing of the transistor was accomplished by using a probe station to contact the aluminum on top of the line, the aluminum on one side of the line and the aluminum gate metal which acts as the gate. Referring to FIG. 8, a graph showing performance $I_{ds}$-$V_{ds}$ curve characteristics for a transistor of the invention with a channel width of 20 micrometers is shown. Two different gate voltages of 1, and 2 volts as well as the bias gate voltages of −10, 0, 10 volts were used. As can be seen in FIG. 8, the drain current versus drain voltage is very responsive to the gate voltage but the bias gate voltage with a positive 10 volts yields a significantly better transistor.

Figure 9:
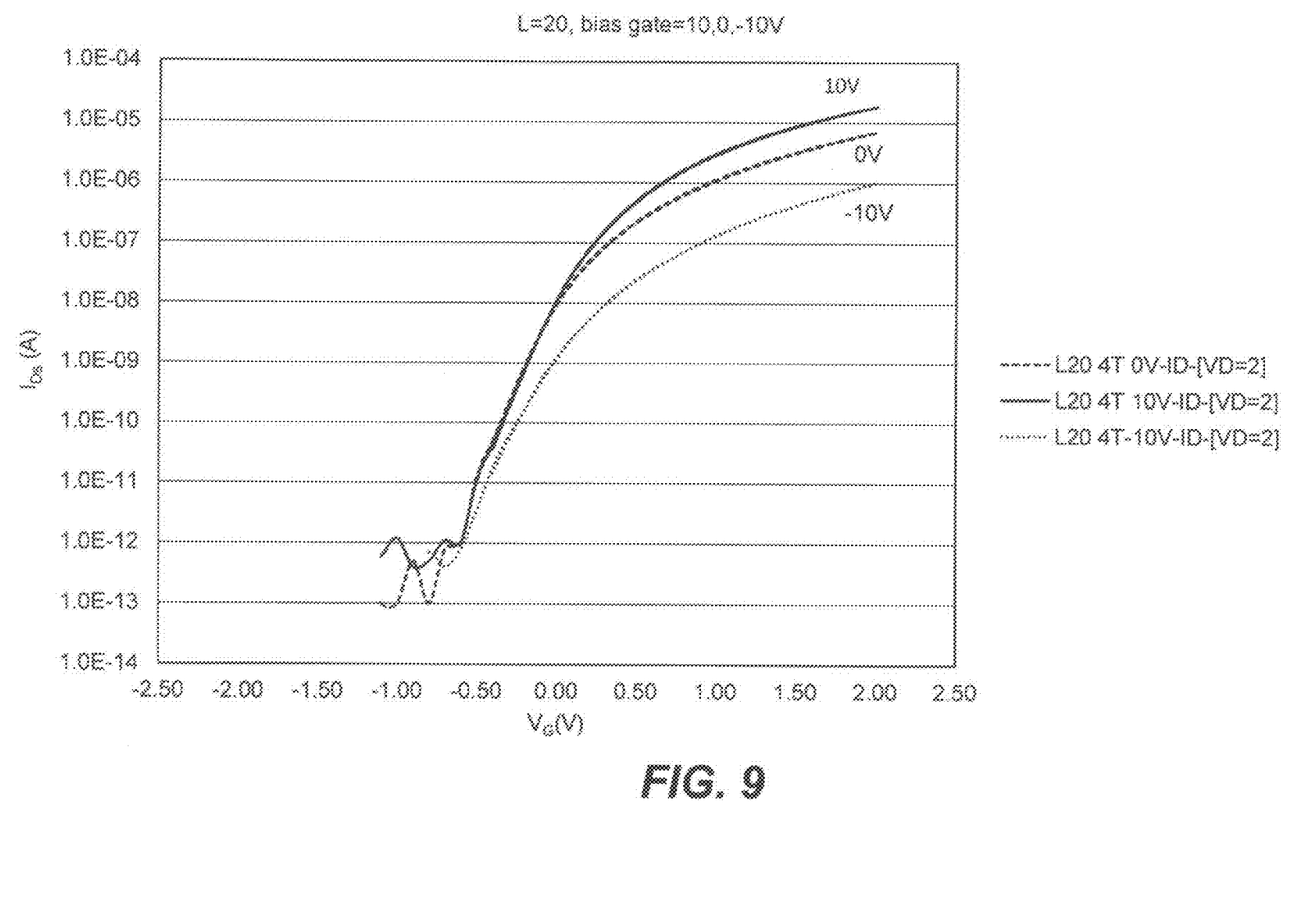
FIG. 9 is a graph showing performance $I_{ds}$-$V_g$ curve characteristics for the transistor shown in FIG. 1.

Referring to FIG. 9, a graph showing performance $I_{ds}$-$V_g$ for 10, 0, and −10 bias gate voltage characteristics for a transistor of the invention with a channel width of 200 micrometers is shown. As can be seen in FIG. 10, the drain current responds well to the gate voltage, ranging from a small current of about $10^{-12}$ amps at a gate of −0.5 volts to greater than $10^{-5}$ amps at a gate of 2 volts for a bias gate voltage of 10 volts. This gives an on-off ratio of $10^7$ at 2 volts on the gate. This drops over an order of magnitude when the bias gate voltage is dropped to −10 from 10 volts. Clearly the bias gate can improve the quality of the transistors as demonstrated. Since it is a bias voltage and not a current, little power is expended and individual patterning for individual transistors is not necessary. All transistors in a circuit may have the same bias voltage and the bias gates all connect. Patterning of the bias gates may be done to allow different biases or done for other reasons as long as the intended function is preserved.

Figure 10A:
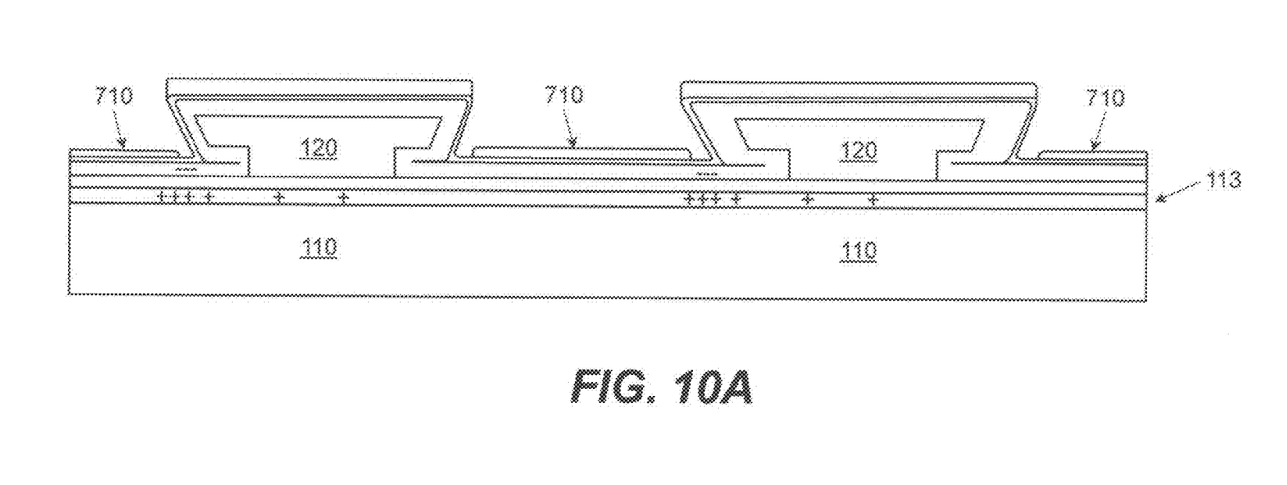
FIG. 10A is a schematic cross-sectional view of a circuit including a plurality of transistors having a common bias gate.
Figure 10B:
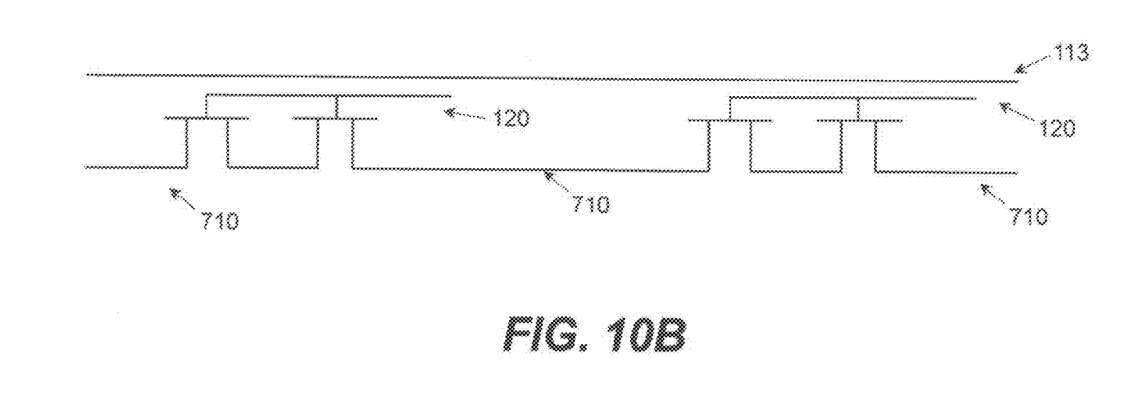
FIG. 10B is the equivalent circuit diagram of the circuit shown in FIG. 10A.

Referring to FIGS. 10A and 10B, a schematic cross-sectional view of a circuit including a plurality of transistors having a common bias gate and the equivalent circuit diagram of the circuit are shown. Bias gate 113 is common to the transistors. In this example embodiment of a circuit, bias gate 113 can be used to uniformly modify characteristics of the transistors in the same manner.

Figure 11A:
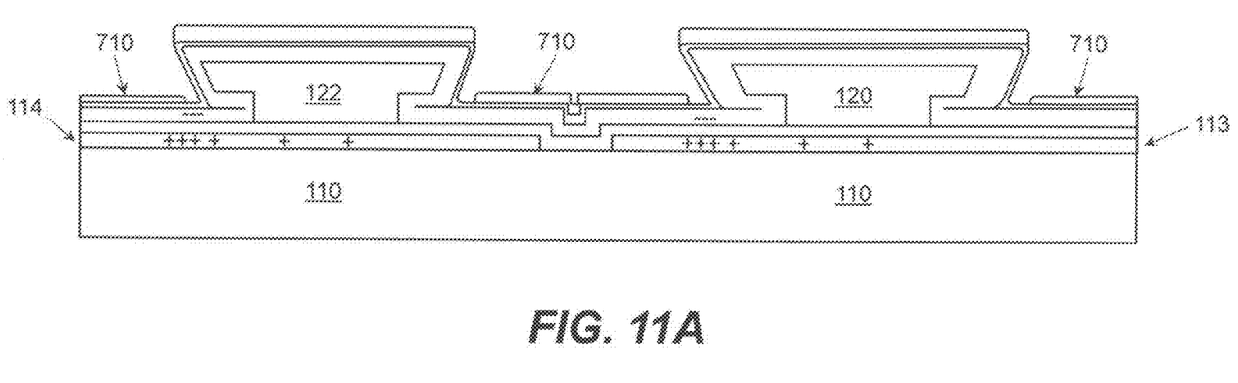
FIG. 11A is a schematic cross-sectional view of a circuit including a plurality of transistors having separate bias gates.
Figure 11B:
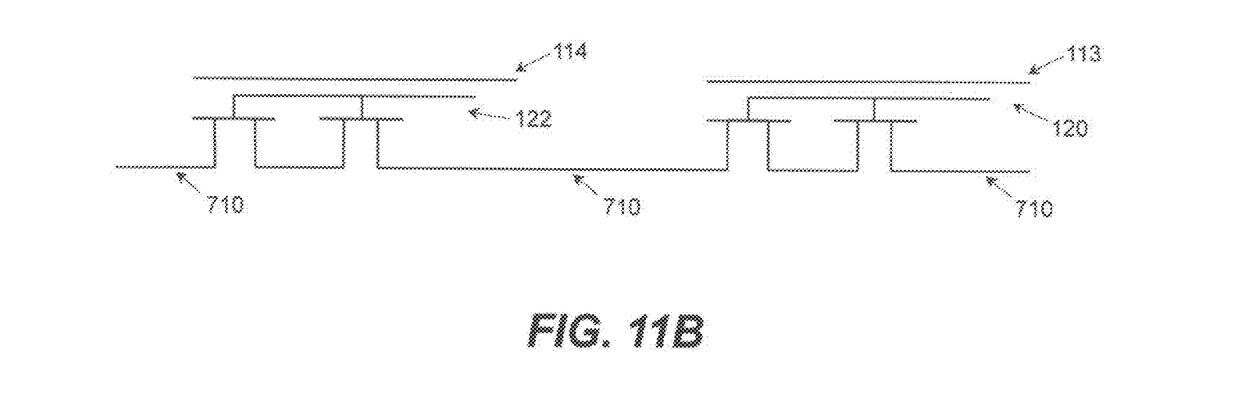
FIG. 11B is the equivalent circuit diagram of the circuit shown in FIG. 11A.

Referring to FIGS. 11A and 11B, a schematic cross-sectional view of a circuit including a plurality of transistors having separated bias gates and the equivalent circuit diagram of the circuit are shown. Bias gate 113 is distinct, separated from bias gate 114. This configuration of the circuit permits distinct, for example, different, voltages to be applied to the transistors independently, for example, separately, when compared to each other.

Figure 12A:
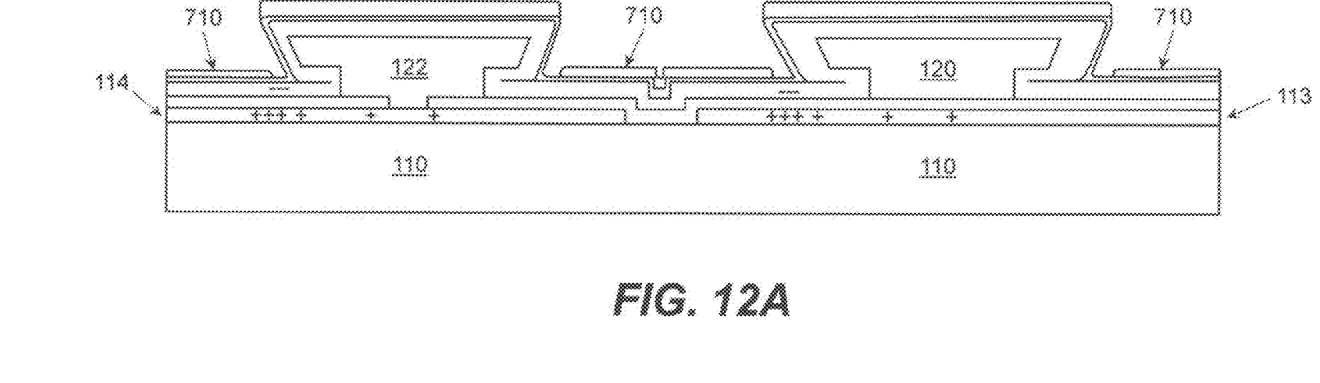
FIG. 12A is a schematic cross-sectional view of a circuit including a plurality of transistors having separate bias gates with one of the gates of one of the plurality of transistors shorted to the corresponding bias gate.
Figure 12B:
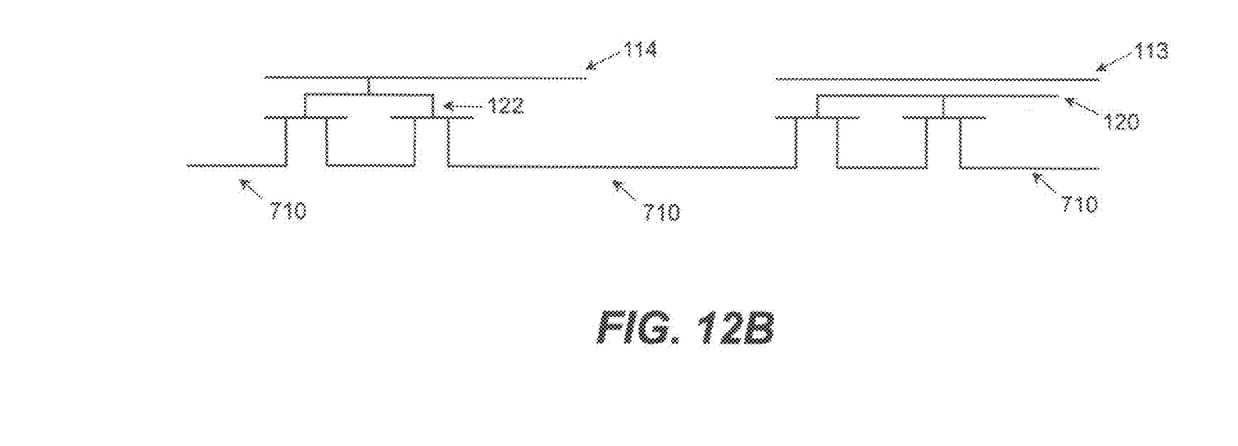
FIG. 12B is the equivalent circuit diagram of the circuit shown in FIG. 12A.

Referring to FIGS. 12A and 12B, a schematic cross-sectional view of a circuit including a plurality of transistors having separate bias gates with one of the gates of one of the plurality of transistors shorted to the corresponding bias gate and the equivalent circuit diagram of the circuit are shown. Bias gate 113 is distinct, separated from bias gate 114. Bias gate 114 is electrically connected to gate 122 of the corresponding transistor so that the bias voltage is the same as the gate voltage for the transistor. Bias gate 113 is unconnected from the gate 120 and therefore a different bias voltage can still be applied to the corresponding transistor.

The invention has been described in detail with particular reference to certain example embodiments thereof, but it will be understood that variations and modifications can be effected within the scope of the invention.

PARTS LIST 100 transistor
110 substrate
113 first electrically conductive layer, bias gate
114 bias gate
116 first electrically insulating layer; first dielectric nonconductive material layer
120 electrically conductive material layer stack, gate
122 gate
140 resist
150 second electrically insulating layer; second dielectric nonconductive material layer
160 semiconductor; semiconductor material layer
170 reentrant profile
700 third electrically conductive material layer
710 electrode(s); source or drain
800 fourth electrically conductive material layer
810 electrode; drain or source
900 directional (nonconformal) deposition arrow

The invention claimed is:

1. A method of producing a transistor comprising:
providing a substrate including in order a first electrically conductive material layer positioned on the substrate and a first electrically insulating material layer positioned on the first electrically conductive material layer;
providing an electrically conductive material layer stack on the first electrically insulating material layer;
forming a gate including a reentrant profile from the electrically conductive material layer stack in which a first portion of the gate is sized and positioned to extend beyond a second portion of the gate;
conformally coating the gate including the reentrant profile and at least a portion of the first electrically insulating material layer with a second electrically insulating material layer;
conformally coating the second electrically insulating material layer with a semiconductor material layer; and
forming source and drain electrodes simultaneously by directionally depositing a second electrically conductive material layer on portions of the semiconductor material layer.

2. The method of claim 1, further comprising forming a plurality of transistors on the substrate using the method of claim 1, wherein the first electrically conductive material layer is patterned to be associated with at least one discrete transistor of the plurality of transistors.

3. The method of claim 1, wherein forming the gate including the reentrant profile from the electrically conductive material layer stack includes using a plasma etchant to remove a portion of the electrically conductive material layer stack.

4. The method of claim 1, wherein forming the gate including the reentrant profile from the electrically conductive material layer stack includes using a liquid etchant to remove a portion of the electrically conductive material layer stack.

5. The method of claim 1, the substrate including a first layer and a second layer, the method further comprising:
removing the second layer of the substrate.

6. The method of claim 1, wherein the substrate is flexible.

* * * * *